(12) United States Patent
Gibson

(10) Patent No.: US 7,148,485 B2
(45) Date of Patent: Dec. 12, 2006

(54) LOW-ENERGY CHARGED PARTICLE DETECTOR

(75) Inventor: Gary A. Gibson, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 274 days.

(21) Appl. No.: 10/857,215

(22) Filed: May 28, 2004

(65) Prior Publication Data

US 2005/0263708 A1 Dec. 1, 2005

(51) Int. Cl.
*G01T 1/24* (2006.01)
*H01L 31/02* (2006.01)

(52) U.S. Cl. ............... 250/370.02; 250/370.01; 250/370.14

(58) Field of Classification Search ........... 250/370.01, 250/370.02, 370.12, 370.14; 257/429, 430; 438/56, 57
See application file for complete search history.

(56) References Cited

U.S. PATENT DOCUMENTS

| | | | | |
|---|---|---|---|---|
| 2,991,366 | A * | 7/1961 | Salzberg | 250/370.01 |
| 3,113,220 | A * | 12/1963 | Goulding et al. | 327/504 |
| 4,868,394 | A | 9/1989 | Fukuhara et al. | |
| 5,051,204 | A * | 9/1991 | Ohsawa et al. | 252/301.4 S |
| 5,093,576 | A * | 3/1992 | Edmond et al. | 250/370.01 |
| 5,376,798 | A * | 12/1994 | Pettit | 250/370.14 |
| 5,557,596 | A | 9/1996 | Gibson et al. | |
| 5,854,506 | A | 12/1998 | Fallica | |
| 6,236,053 | B1 | 5/2001 | Shariv | |
| 6,377,345 | B1 | 4/2002 | Powell | |
| 6,465,857 | B1 | 10/2002 | Patti et al. | |
| 6,479,825 | B1 * | 11/2002 | Weiss | 250/370.02 |
| 6,489,775 | B1 | 12/2002 | Rigby et al. | |
| 6,545,330 | B1 * | 4/2003 | Bernstein et al. | 257/428 |
| 2002/0113250 | A1 * | 8/2002 | Chaiken et al. | 257/200 |
| 2004/0085802 | A1 * | 5/2004 | Gibson | 430/270.13 |
| 2005/0023522 | A1 * | 2/2005 | Frey et al. | 257/40 |

OTHER PUBLICATIONS

"Characterization and application of a low-profile metal-semiconductor—metal detector for low energy backscattered electrons" G.D. Meier et al, J. Vac. Sci. Tech. B14, 3821 (1996).

Jaegermann, W. et al. "Electronic properties of van der Waals-epitaxy films and interfaces" Electron Spectroscopies Applied to Low-Dimensional Materials, Dordrecht, 2000, pp. 1-93.

Meier, G.D., et al. "Characterization and application of low-profile metal-semiconductor-metal detector for low energy backscattered electrons"; J. Vac. Sci. Technol.B (14)6, Nov./Dec. 1996, pp. 3821-3824.

* cited by examiner

*Primary Examiner*—Albert Gagliardi

(57) ABSTRACT

A low energy charged particle detector having a diode with a first layer and a top layer physically coupled to the first layer. The intersection between the first layer and the top layer defines a junction. The top layer is composed of a two-dimensional material such as a chalcogen-based material, providing an electrically passivated exposed outer surface opposite to the junction. The outer surface is exposed to receive low-energy charged particles from external sources. An appropriate control circuit is coupled to the diode, and operable to recognize the incidence of a particle upon the outer surface as a change in current or voltage potential.

25 Claims, 4 Drawing Sheets

LOW-ENERGY CHARGED PARTICLE DETECTOR

FIELD OF THE INVENTION

The present invention relates generally to charged particle detectors, and in particular to the detection of low-energy atomic or nuclear particles such as electrons with semiconductor low-energy particle detectors.

BACKGROUND

The detection of low-energy particles is a task relevant to many fields. Such fields non-exclusively include electron microscopy, astronomy and electron beam lithography. In certain applications, it may also be desirable for surface analysis devices to utilize low-energy charged particle detection. Additionally, there is often a need for low-energy charged particle detectors in scientific experiments and applications.

Various types of detectors have been used for these applications. They include scintillation-based detectors such as Everhart-Thornley detectors that convert low-energy charged particles into photons and then convert the photons into an electrical signal; solid-state devices akin to photodiodes or phototransistors (cathododiodes or cathodotransistors); cathodconductivity devices, and MSM devices (described in an article by G. D. Meier et al, J. Vac. Sci. Tech. B14, 3821 (1996)).

Cathododiodes may be made in the form of pn-junctions, pin-junctions, avalanche diodes or Schottky barriers. Typically, when a charged particle such as an electron is incident upon a semiconductor layer in the cathododiode, it creates electron-hole pairs.

The functional properties of a semiconductor result, in part, from providing electrons in different energy states separated by bands or gaps of no energy states. The highest occupied band is a valence band and the lowest unoccupied band is a conduction band, with a gap existing in between. As used, the terms "highest" and "lowest" refer to energy levels and not physical vertical separation. When an electron or other ionizing radiation strikes a semiconductor detector, it will excite electrons present in the valence band of the detector into the conduction band, consequently leaving holes in the valence band. This process is known as the creation of electron-hole ("EH") pairs.

The creation of an electron-hole pair provides two charge carriers that are opposite in polarity (an electron and a hole). With respect to these carriers, the non-dominant carrier is typically referred to as the minority carrier while the dominant carrier is referred to as the majority carrier. The roll of an electron as a minority or majority carrier is determined by the device configuration. Solid-state detectors typically provide an electrical field via a depletion region (a built in field) and/or an applied potential as a means for separating these carriers. It is understood and appreciated that certain types of devices, such as cathodoconductivity devices do not provide a depletion region.

Charged particles created in such an electric field (built in or applied) will tend to be swept out of it. For example, in a pn-diode after an EH pair is created a positive charge carrier will be swept towards the p-type region by the depletion layer's electric field, and a negative charge carrier will be swept towards the n-type region by the depletion layer's electric field.

In a diode, including a cathododiode, the movement of these charge carriers constitutes a current that can be measured. For the current induced by the generation of EH pairs to be measured, the resulting charge carriers must survive for a duration of time sufficient to permit them to be swept across the depletion region.

The penetration depth of low-energy particles incident upon a semiconductor is quite short. For example, the penetration depth, or Grun range, of electrons with less than 1 keV of energy is less than 10 nm in most semiconductors. At 100 eV the penetration depth is typically only a few nanometers, or less. As such, the EH pairs that are created are created very close to the surface of the semiconductor.

Conventional semiconductor fabrication processes typically generate defects such as dangling or frustrated bonds at the surface. These and other surface defects, (such as, for example oxidation) cause problems such as surface recombination, surface band-bending, surface traps and other surface related conditions that can thwart the detection of the EH pair, by causing charge carriers created close to the surface to recombine before they are swept across the depletion region.

Cathodotransistors also rely on the creation of EH pairs and the consequent changes in carrier densities. These changes in carrier density affect the height of the energy barriers between layers of the device that gate a flow of carriers across the layers. Like the cathododiodes described above, the performance of the cathodotransistors is adversely impacted when the generated carriers (the EH pairs) are generated in close proximity to a surface that causes most of the carriers to recombine quickly. Thus, cathodotransistors can also have a low efficiency in the detection of low-energy charged particles.

Similarly, the efficiency of cathodoconductivity-based devices can be adversely impacted by semiconductor surfaces that reduce the lifetime of generated carriers. Scintillating materials also tend to radiate less efficiently when stimulated by low-energy charged particles due to common occurrence of surface defects.

In addition, many of the above-described devices are susceptible to having large dark, or leakage, currents that make it difficult to detect the signal currents generated by the low-energy particles.

Hence, there is a need for a low-energy particle detector semiconductor device that overcomes one or more of the drawbacks identified above.

SUMMARY

The present disclosure advances the art and overcomes problems articulated above by providing a low-energy particle detector.

In particular, and by way of example only, according to an embodiment of the present invention, this invention provides a low energy charged particle detector including a diode having; a top layer with a first connectivity; a first layer with a second connectivity physically coupled to the top layer with a rectifying junction therebetween, the top layer composed of a two-dimensional material providing an electrically passivated exposed outer surface opposite the junction; and a control circuit coupled to the diode.

In yet another embodiment, this invention provides a low energy charged particle detector including a cathodoconductive device having: an electrically insulating substrate; a top layer disposed upon the substrate, the top layer composed of a two-dimensional material providing an electrically passivated exposed outer surface, the top layer having a first end and opposite thereto a second end; at least one first electrode disposed proximate to the first end of and in electrical contact with the top layer; at least one second electrode disposed proximate to the second end of and in electrical contact with the top layer; a control circuit coupled to the first and second electrodes.

In yet another embodiment, this invention provides a low energy charged particle detector including: a cathodotransistor device having: a first layer; a top layer composed of a two-dimensional material providing an electrically passivated exposed outer surface; an intermediate layer disposed between the first layer and the top layer; at least one junction between the first layer and the top layer, defined by the intermediate layer; a first voltage potential coupled to the top layer; and a second voltage potential, unequal to the first voltage potential coupled to the first layer.

DETAILED DESCRIPTION

Before proceeding with the detailed description, it is to be appreciated that the present teaching is by way of example, not limitation. The concepts herein are not limited to use or application with a specific type of low-energy charged particle detector. Thus, although the instrumentalities described herein are for the convenience of explanation, shown and described with respect to exemplary embodiments, it will be appreciated that the principals herein may be equally applied in other types of low-energy particle detection.

Figure 1:
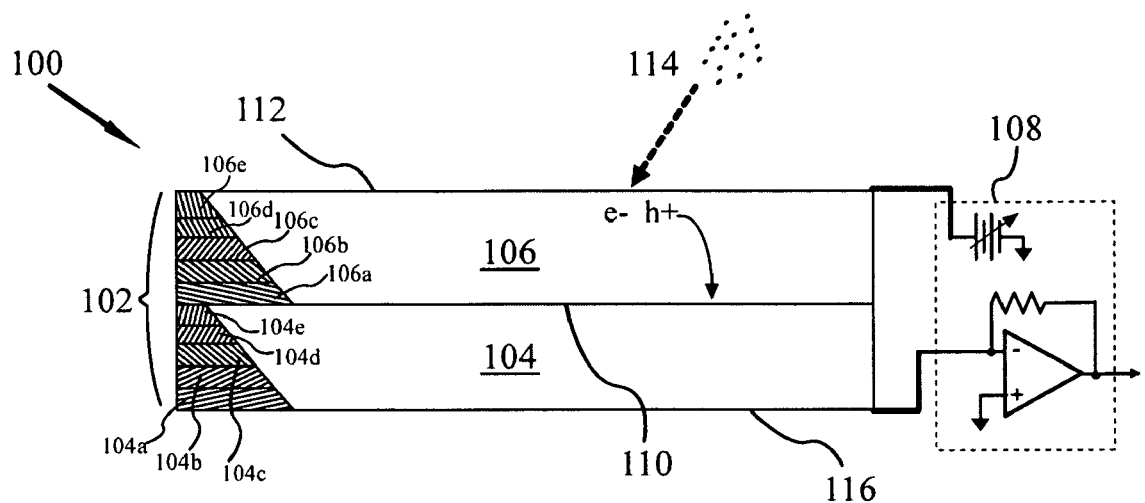
FIG. 1 is a conceptual side view illustration of a low-energy particle detector according to one embodiment.

Referring now to the drawings, and more particularly to FIG. 1, there is shown a portion of a low-energy charged particle detector (LECPD) 100, according to one embodiment. More specifically, the LECPD 100 includes a diode 102 and a control circuit 108 coupled to the diode 102. The control circuit 108 may also be referred to as a detection circuit. The diode 102 may be any type that provides a built-in field for separating charged carriers, such as a PN junction, PIN junction, Schottky barrier device or other type of "electronic valve" as such devices are known in the art.

The diode 102 includes a top layer 106 with a first electrical connectivity and a first layer 104 with a second electrical connectivity physically coupled to the top layer 106. Such coupling may be achieved by depositing the top layer 106 directly on top of the fir the first layer 104. The point of contact between the top layer 106 and the first layer 104 provides an interface, also known as a junction 110. The electrical connectivity of each layer 104 and 106 is determined by factors such as differences in carrier concentrations, carrier types, and or band structures. A built-in field may result from factors such as differences in carrier concentrations, carrier, or band structure in each layer 104 and 106.

An external circuit (not shown) may superimpose an addition applied field on the built-in field, or provide a carrier separating field when the structure does not otherwise provide a built in field. To advantageously improve longevity of EH pairs and thus improve the detection of low-energy particles, the top layer 106 is composed of a two-dimensional material providing an electrically passivated outer surface 112 opposite the junction 110. The term "electrically passivated" will be more fully discussed and described below following the physical description of the LECPD 100.

As used herein, the terms "two-dimensional materials," "two-dimensional layer," "2-D material," "2-D layer," "2-D film" and "2-D substrate" refer to aniso bonded materials, including materials that form layers adhered internally by strong internal bonding, such as strong covalent or ionic bonds, and connected to adjacent layers by relatively weak interlayer bonds, primarily van der Waals forces or, alternatively, relatively weak covalent or ionic bonds.

Two-dimensional layers typically exhibit relatively strong internal bonding within layers, primarily due to the covalent or ionic forces that may be referred to as a van der Waals layering effect. See, e.g., Jaegermann et al, "*Electronic Properties of van der Waals-epitaxy Films and Surfaces*," Physics and Chemistry of Materials with Low-Dimensional Structures, vol. 24, pp. 317–402. Thus, 2-D layers are formed that can be easily terminated in an atomic sense (see FIGS. 4 and 5 and discussion below). More specifically, easily terminated structures have surfaces that are relatively free from defects such as dangling bonds and recombination or trapping sites. Many chalcogen-based materials, based on selenium, tellurium or sulphur, form structures that exhibit this van der Waals layering effect.

Preferably, the top layer 106 is a 2-D chalcogen-based material. "Chalcogens" is the name given the elements of group 6 in the periodic table. Group 6 consists of oxygen (O), sulfur (S), selenium (Se), tellurium (Te), and radioactive polonium (Po). As is discussed below, a 2-D chalcogen based top layer 106 advantageously minimizes dangling bonds at the outer surface 112 that would otherwise frustrate the detection of EH pairs.

The electrically passivated outer surface 112 is exposed for the purpose of receiving low-energy particles. Under appropriate circumstances a protective casing may be provided to substantially enclose and protect the LECPD 100. However, to perform the intended function of low-energy particle detection, it is understood that the protective casing will not enclose the exposed surface 112.

Figure 6:
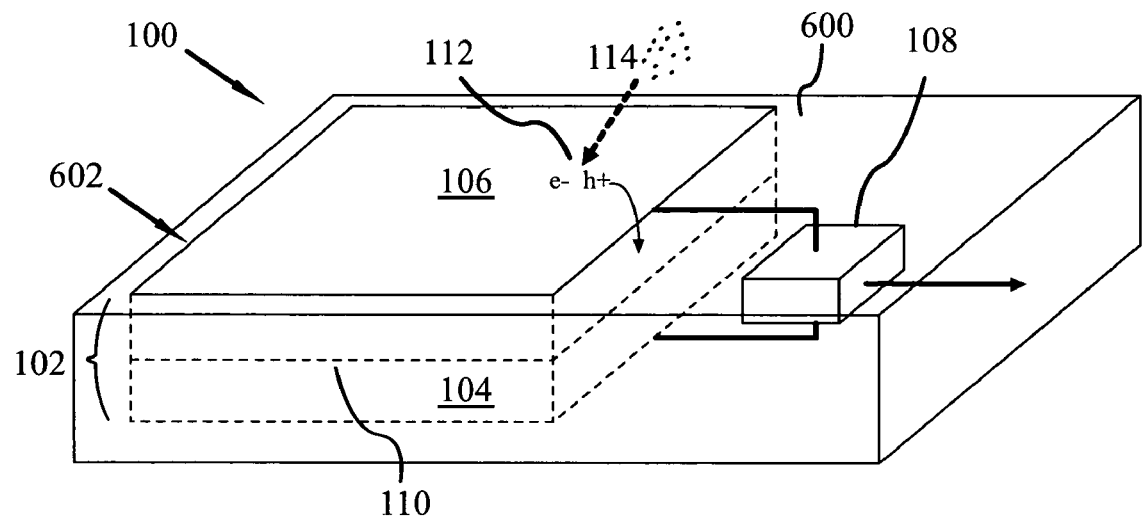
FIG. 6 is a perspective view of the embodiment shown in FIG. 1.

FIG. 6 is a perspective view of the LECPD 100 shown in FIG. 1. As shown, a casing 600 substantially encloses and protects diode 102 and control circuit 108. The outer surface 112 is substantially unencumbered or otherwise unshielded by other components of the LECPD 100 that might interfere with, block, deflect, or inhibit externally generated low-energy particles from reaching the external surface 112. Moreover, casing 600 of the LECPD 100 will provide a substantially unobstructed window or aperture 602, permitting substantially unencumbered, direct, access to the outer surface 112 by low-energy charged particles emanating from an external source (not shown). For example, if the LECPD 100 is employed in an electron microscope or astronomical device, the LECPD 100 will be so positioned so that the outer surface 112 is presented to an intended source of low-energy particles.

Returning again to FIG. 1, in at least one embodiment, the first layer 104 is N-type, such as resulting from n-type doping as known within the art, for instance, whereas the top layer 106 is P-type, such as resulting from p-type doping as known within the art. In an alternative embodiment, the first layer 104 is p-type and the top layer 106 is n-type.

Low-energy particles and/or electrons, such as low-energy charged particles 114 that are incident upon the outer surface 112 may excite EH pairs within top layer 106, and more specifically near the outer surface 112 of the diode 102. EH pairs may be represented as "e⁻ h⁺". More simply stated, when low-energy charged particles strike the outer surface 112 of the diode 102, the impacting particle may excite an electron (e⁻) out of its energy level, leaving a hole (h⁺). The electron and the hole are commonly referred to as generated carriers—each having an opposite charge.

Some fraction of the generated carriers of one charge (either the electrons or the holes) will be swept across the junction 110 under the influence of the built-in field. The term "collection efficiency" is commonly applied to this behavior. In normal operation it is the minority carriers that will be swept across the junction 110. The collection efficiency is dependent upon, among other things, the recombination rate and carrier mobility in and around the area of the outer surface 112 upon which the low-energy charged particles are incident upon and the effect of the built-in field within the diode 102. To assist with the sweeping of the carriers across the junction 110, in at least one embodiment, an additional field (not shown) is applied across the junction 110 by control circuit 108.

More specifically, in at least one embodiment the control circuit 108 further includes a biasing circuit (not shown) operable to bias the top layer 106 relative to the first layer 104, to promote the flow of carriers (electrons or holes), depending upon the material used. The use of a reverse bias is preferred so as to help reduce the likelihood of leakage current through the diode 102.

In at least one embodiment the LECPD 100 is reverse biased by external control circuit 108 so that the minority carriers that are generated by the incident particles 114 are swept toward the junction 110. The electrons that reach the pn junction 110 will be swept across the junction 110. Moreover, minority carriers that do not recombine with the majority carriers before reaching the junction 110 are swept across the junction 110, causing a current to flow in the external control circuit 108.

Detection of the carriers as they move or attempt to move across the junction 110 may be accomplished by at least two different methods. Under a first method, the detection is accomplished by monitoring a current flow through diode 102. More specifically, in at least one embodiment, the control circuit 108 is established with a low input impedance. The current that results from the carriers passing across the junction 110 can be monitored as a signal current flowing into the control circuit 108. More specifically the control circuit 108 is also a detection circuit.

Under a second method, the detection is accomplished by monitoring the change in voltage potential developed across the diode 102. More specifically, in at least one embodiment, the control circuit 108 is established with a high input impedance. As low-energy charged particles 114 impact upon the outer surface 112 and release EH pairs, the EH pairs will separate by the built-in field of the diode 102. In this configuration, there will be no applied potential as the first layer 104 and top layer 106 of the diode 102 will establish their own potential.

As the carriers are generated and flow towards one side or the other, a charge within the diode 102 will develop and start to counter the built-in field, eventually reaching a steady state. The resulting electrostatic potential between the outer surface 112 and the bottom 116 of the first layer 104 can be measured as a difference in voltage potential.

Figure 2:
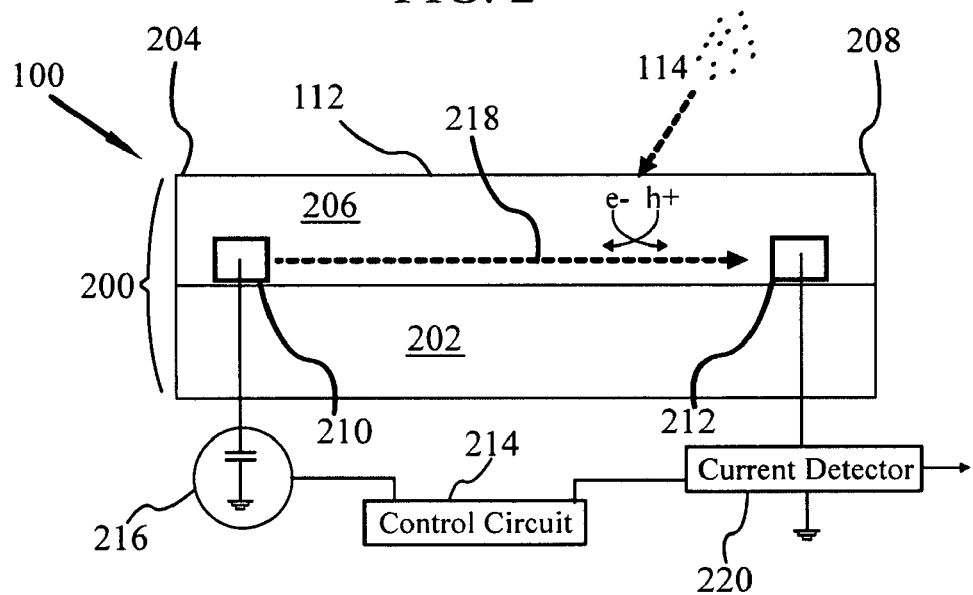
FIG. 2 is a conceptual side view illustration of a low-energy particle detector according to another embodiment.

Turning now to FIG. 2, provided is a conceptual illustration of a LECPD 100 operating as a cathodoconductive device 200. An electrically insulating substrate 202, such as silicon with an oxidized top layer, is provided as a base for the cathodoconductive device 200. A top layer 206 is disposed upon the substrate 202. The top layer 206 is substantially equivalent to the top layer 106, shown and described in to FIG. 1.

Specifically top layer 206 is composed of a 2-D material providing an electrically passivated outer surface 112, opposite to the substrate 202. The top layer 206 is further described as having a first end 204 and a second end 208. As with top layer 106 FIG. 1, the top layer 206 of FIG. 2 is preferably a 2-D chalcogen-based material.

A plurality of spaced electrodes are provided in direct electrical contact with the top layer 206. More specifically, in at least one embodiment, a first electrode 210 is disposed proximate to the first end 204 and a second electrode 212 is disposed proximate to the second end 208. The 2-D material of the top layer 206 may be deposited over or under the first and second electrodes 210, 212. A control circuit 214 is coupled to the first and second electrodes 210, 212.

In at least one embodiment, the control circuit 214 includes a voltage source such as power supply 216 that applies a bias voltage across the first and second electrodes 210, 212. This bias voltage induces an electric field, represented as arrow 218, in the plane of the top layer 206. The power supply 216 may be fabricated on the substrate 202, and/or be an integrated part of the control circuit 214, or it may be provided from an externally connected source.

Figure 7:
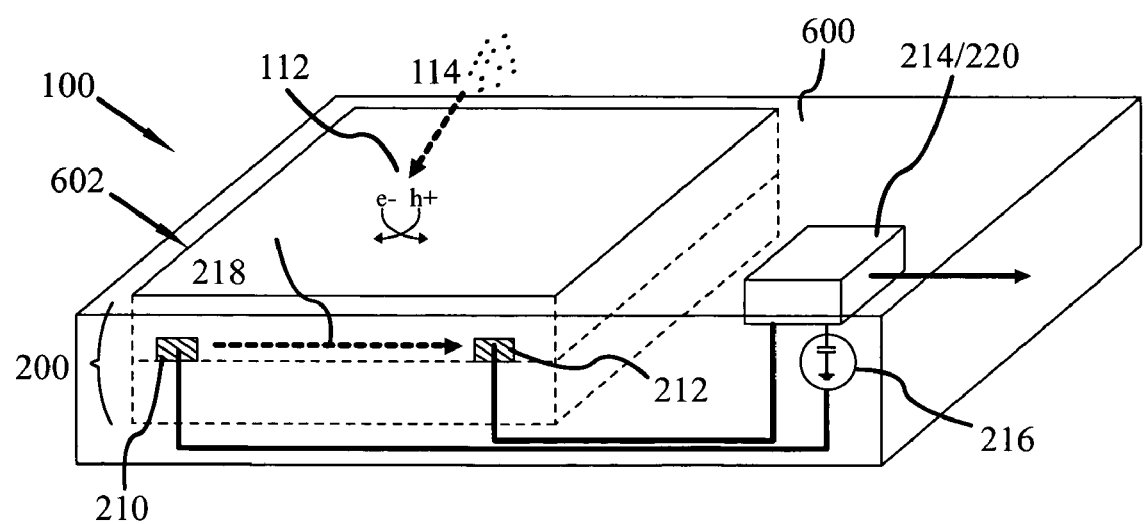
FIG. 7 is a perspective view of the embodiment shown in FIG. 2.

As with the top layer 106 shown in FIG. 1, the electrically passivated outer surface 112 is exposed for the purpose of receiving low-energy particles, such as charged particles 114. As shown in FIG. 7, under appropriate circumstances, a protective casing 600 may be provided to substantially enclose and protect the LECPD 100. However to perform the intended function of low-energy particle detection, it is understood that the protective casing will not entirely enclose the LECPD device. Specifically, any such casing or external shell supporting the LECPD 100 will provide a substantially unobstructed window or aperture 602, permitting substantially unencumbered access to the outer surface 112 by low-energy charged particles 114 emanating from an expected external source.

Low-energy particles, such as charged particles 114, that are incident upon the outer surface 112 excite EH pairs near the outer surface 112 of the top layer 206. These carriers (holes and electrons) are accelerated by the electric field 218 towards either electrode 210 or 212, depending upon the charge of their respective charges and the direction of the applied voltage field, i.e., as represented by arrow 218. This movement of the electron and hole carriers represents a current flow within the top layer 206.

This current may be detected by a control circuit 108 to provide an output signal indicating particle detection. More specifically, the control circuit 214 of LECPD 100 provides a current detector 220 that is operable to detect current between the first and second electrodes in response to a low-energy particle such as charged particles 114 striking the outer surface 112.

Figure 3:
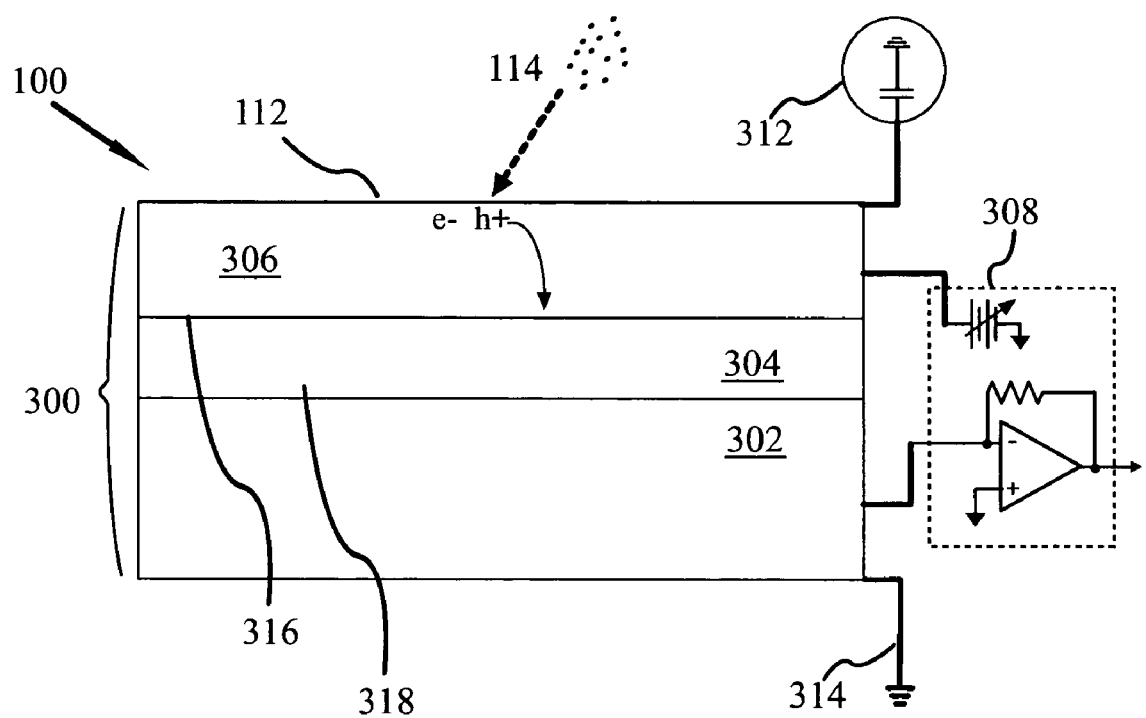
FIG. 3 is a conceptual side view illustration of a low-energy particle detector according to yet another embodiment.

Turning now to FIG. 3, provided is a conceptual illustration of LECPD 100 operating as a cathodotransistor device 300. The cathodotransistor device 300 operates in a similar fashion to the diode 102 described above in FIG. 1.

As shown, three semiconductor layers are provided. Specifically, a first layer 302 is provided. A top layer 306, substantially equivalent to the top layer 206 in FIG. 2 and the top layer 106 in FIG. 1, is also provided. More specifically, the top layer 306 is composed of a 2-D material, providing an electrically passivated exposed outer surface 112. As with the embodiments shown in FIGS. 1 and 2, the top layer 306 is preferably a 2-D chalcogen-based material.

As above, the outer surface 112 is a charged particle receiving surface set to receive unobstructed low-energy charged particles 114 emanating from an external source. A protective case may be provided in a substantially similar manner as shown and described with respect to FIGS. 6 and 7 above, specifically protecting the LECPD 100 while providing substantially unencumbered access to outer surface 112 by charged particles 114.

An intermediate layer 304 is disposed between the first layer 302 and the top layer 306. The top layer 306, intermediate layer 304 and first layer 302 are typically arranged as p-n-p layers or n-p-n layers, achieved with appropriate doping as is known in the art. In FIG. 3, the layers are arranged as n-p-n, with carriers moving through the layers.

The top layer 306 is biased relative to the first layer 302. A control circuit 308 is electrically coupled to the top layer 306 and the first layer 302. A bias may be achieved by the control circuit 308 providing a first voltage potential to the top layer 306 and a second voltage potential to the first layer 302. The bias is achieved by providing a second voltage potential that is unequal to the first voltage potential. In an alternative embodiment, a separate voltage source 312 is directly connected to top layer 306 and first layer 302 is connected to a ground potential 314.

As indicated, first layer 302 and top layer 306 are preferably of the same type, p or n, while the intermediate layer 304 is of the opposite type, n or p. As a result, a junction 316 is provided at the interface of top layer 306 and intermediate layer 304, and another junction 318 is provided at the interface of intermediate layer 304 and first layer 302. Junctions 316 and 318 are heterotype junctions as the layers on either side have different carrier types. By comparison, if intermediate layer 304 and first layer 302 were of the same type with top layer 306 being of a different type, junction 318 would be a homotype junction. Either type of junction may be used in an embodiment of the invention. More specifically, at least one junction 316 and or 318 located between the first layer 302 and the top layer 306 is defined by the intermediate layer 304.

It is noted that the type of carrier used is one aspect for properly designing the LECPD 100. More generally, the LECPD 100 as shown in FIGS. 1 and 3 is designed with an appropriate combination of layers, wherein each layer has an appropriate thickness, band gap, electron affinity, and carrier concentration. Thus, the type of material used for the layers, and whether the junctions between the layers are heterotype or homotype junctions, is as important in designing the LECPD 100 as the type of carrier employed. In addition, for conceptual simplicity and ease of discussion, each layer in each figure is illustrated as a single layer; however, it is understood that each layer itself may be comprised of multiple layers which function together as a contiguous layer.

As the embodiment illustrated in FIG. 3 operates as a cathodotransistor, the intermediate layer 304 acts as a floating base, which is controlled by low-energy charged particles 114 impacting upon the exposed outer surface 112. The cathodotransistor device 300 is active, or dynamic, in that the effective resistance between the source and the collector can change because of a change in conditions, specifically the presence or absence of low-energy charged particles 114 impacting upon the outer surface 112.

Without the incidence of charged particles 114 incident upon the outer surface 112, a barrier to the flow of majority carriers (in this case electrons) between the top layer 306 and the first layer 302 exists at either junction 316 or junction 318. For example, when the majority carriers in layer 306 are electrons this barrier is in the form of an increase in the energy of the conduction band in going from the top layer 306 to the intermediate layer 304.

With the n-p-n configuration as shown, the incidence of low-energy charged particles 114 upon the outer surface 112 generates EH pairs. The selected materials for the three layers are chosen specifically to provide an overall device band structure with at least the following two properties. First, a band offset at one of the interfaces (316 or 318) that acts as a barrier to conduction to the majority carrier from the top layer 306. Second, a potential well is established for the carriers of the other type (in this case holes) in the middle layer. The potential well is caused by either a maximum in the valance band or a minimum in the conduction band, the appropriate maximum or minimum values determined by the materials involved.

In at least one embodiment, based upon appropriate combinations of materials, bandgaps, electron affinities, doping levels, and doping types, and appropriate combinations thereof, the generated holes will diffuse to and collect in the potential well formed by intermediate layer 304 as a maximum in the valence band. The resulting increased hole density in the intermediate layer 304 will lower the energy of the conduction band in this layer and thereby lower the barrier to electron conduction at the junction 316.

The cathodotransistor 300 therefore exhibits an effective change in resistance when low-energy charged particles 114 are incident upon outer surface 112, as compared to when low-energy charged particles 114 are not incident upon outer surface 112. As a result of this change in resistance, a current flows between the first and second voltage potentials, and this current is detected by control circuit 308. A current detector provided by the control circuit 308 is operable to detect current through the cathodotransistor 300 in response to a low-energy particle 114 striking the outer surface 112.

As stated above with respect to the embodiments shown in FIGS. 1, 2 and 3, the LECPD 100 preferably utilizes 2-D chalcogen-based materials as top layer 106, 206 and 306 to provide an electrically passivated exposed outer surface. This characteristic is based upon the advantageous nature of chalcogen-based materials having weak van der Waals bonding between the internal layers of the materials.

Figure 4:
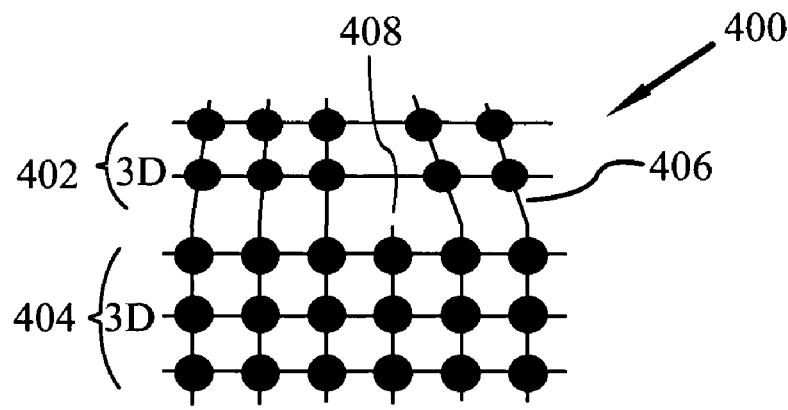
FIG. 4 conceptually illustrates and compare conventional 3-D crystal structures and resulting interfaces.

FIG. 4 illustrates a conventional epitaxial structure 400 between two 3-dimensional crystals 402, 404 with different physical structures. Strong, direct covalent bonds join crystal 402 to crystal 404, yet because of the structural differences, these bonds may be stressed, shown as angled bonds 406. In addition, defects such as dangling bonds 408 may occur where a crystal lattice mismatch occurs between the two materials. These dangling bonds and mismatches in the crystal lattice demonstrate that the materials are not uniformly terminated in an atomic sense.

The dangling bond 408 will be repeated many times at the interface between the two materials 402 and 404, and will cause discontinuities, stresses and strains in the junction interface that will result in electrically active defects that inhibit the propagation and longevity of EH pairs necessary for low-energy particle detection. In addition, the stresses and strains in the junction interface may propagate through the crystal structure to result in dangling bonds, and recombination or trapping sites at the outer surface 112.

Figure 5:
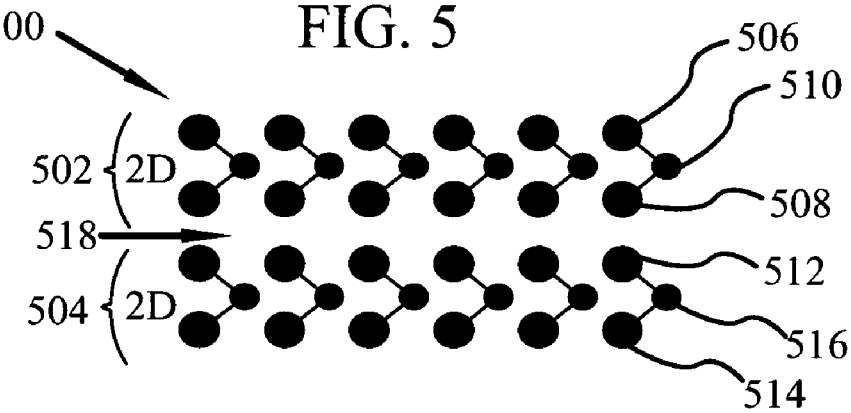
FIG. 5 conceptually illustrates a conventional 2-D crystal structure and resulting surface.

In contrast, FIG. 5 shows a crystalline structure 500 involving two sheets 502, 504 of 2-D materials. Sheet 502 consists of two atomic layers 506 and 508 of a first element tightly bonded with an atomic layer 510 of a second element. Similarly, sheet 504 contains two atomic layers 512 and 514 of a third element tightly bonded with an atomic layer 516 of a fourth element.

Bonding of the elements within each sheet takes place primarily by covalent or ionic forces. Thicker films, or layers of each material consist of stacks of sheets primarily bonded by weak van der Waals forces (not shown). The two sheets 502 and 504 are also loosely bonded at the heterointerface 518 primarily by van der Waals forces. This bonding is sufficient to give orientation to a heteroepitaxial film, but is too weak to cause any substantial strain at the heterointerface 518. Such bonding also does not result in or provide frustrated or dangling bonds such as are shown in FIG. 4. Moreover, the two sheets 502 and 504 are easily terminated. In comparison with the crystal structure shown in FIG. 4, it is appreciated that the structure of FIG. 5 provides minimal dangling bonds.

This type of layered bonding results in two-dimensional (2-D) epitaxial layers with relatively clean and inert interfaces that minimize defects, stress and strain at the interfaces and result in the growth of more defect-free films.

Moreover, as discussed above, this class of materials is characterized by strong covalent or ionic bonding within layers and primarily weak van der Waals bonding between internal layers. For example, the compounds InSe, InTe, GaSe, and GaS, can exist in a crystal structure that consists of sheets comprised of four planes of atoms that repeat in the sequence of chalocogen-M-M-chalcogen, where M is Ga or In. One such class of 2-D materials is known as the so-called layered van der Waals compounds. These include:

the III–VI compounds InTe, InSe, GaSe, GaS, and the hexagonal (metastable) form of GaTe;

the IV–VI compounds GeS, GeSe, SnS, SnSe, $SnS_2$, $SnSe_2$, and $SnSe_{2-x}S_x$;

the metal dichalcogenides $SnS_2$, $SnSe_2$, $WS_2$, $WSe_2$, $MoS_2$, $MoSe_2$;

the transition metal chalcogenides $TiS_2$, $TiS_3$, $ZrS_2$, $ZrS_3$, $ZrSe_2$, $ZrSe_3$, $HfS_2$, $HfS_3$, $HfSe_3$, and $HfSe_3$;

certain modifications, e.g., certain crystalline structures of $Ga_2S_3$, $Ga_2Se_3$, $Ga_2Te_3$, $In_2Se_3$, $In_2S_3$, $In_2Te_3$, $GeS_2$, $GeAs_2$, and $Fe_3S_4$, and ternary materials having a 2-D layer structure, including ternary chalcogenides having a 2-D layer structure, such as $ZnIn_2S_4$ and $MnIn_2Se_4$.

The bonds within each of these four atomic layer sheets tend to be strong covalent or ionic bonds. However, there are primarily only weak van der Waals bonds between the chalcogen layers at the top and bottom of each four plane sheet. It is this weak van der Waals bonding that provides many of the advantages of the LECPD 100.

Specifically, the free surfaces of the 2-D layered materials providing the outer surfaces 112 are typically free of dangling covalent or ionic bonds that plague the surface electronic properties of many conventional semiconductors, such as silicon. As a beneficial consequence, the surfaces of these 2-D materials have been observed to be relatively free of problems due to surface recombination, surface band-bending, Fermi level pinning and electronic surface traps.

These conditions typically result in shorter carrier lifetimes, lower carrier mobilities, and carrier densities that are either too high or too low, defect levels in the bandgaps, frustrations in the intentional p or n doping of the layers, and other undesirable conditions. Simply stated, the surfaces provided by these 2-D materials are electrically passivated against these problems.

These factors are particularly important in the detection of low-energy charged particles 114, as EH pairs caused by low-energy charged particles 114 impacting upon the outer surface 112 are created close to the outer surface 112. The existence of defects in the outer surface 112 would frustrate the detection of these EH pairs. In addition, the junctions 110 and 316 illustrated in FIG. 1 and FIG. 3, respectively, as they exist between the 2-D materials providing the outer surface 112 and a first layer 104, 302 of FIGS. 1 and 3, respectively, also have fewer electronic and structural inconsistencies than junctions between two non 2-D materials.

The advantageous benefit of utilizing 2-D materials is most evident with respect to the top layer 106, 206, 306 of FIGS. 1, 2 and 3 respectively. Although the use of a 2-D material for the first layer 104, 304 of FIGS. 1 and 3 respectively further improves the operation of the LECPD 100, under appropriate circumstance, such as to improve electrical connectivity properties, the first layer 104 and 304 may be composed of a 3-D material. In such cases the inherent inconsistencies between the 2-D and 3-D interface are not as critical at the junction interface 110, 316 and 318 of FIGS. 1 and 3 respectively as opposed to the outer surface 112.

Because uniformity of outer surface 112 is an advantageous characteristic of the LECPD 100, under appropriate circumstances it may be desired to provide a thin protective layer over the outer surface 112. For example, such a protective layer may be provided to guard against oxidation or evaporation of certain chalcogen-based materials. Such a protective layer is preferably charged particle transparent, such as layer of low mass-density carbon, for example. In other words, although it provides a layer of physical protection to the outer surface 112, the protective layer does not obstruct or otherwise substantially reduce the energy delivered by low-energy charged particles 114 to the outer surface 112.

Changes may be made in the above methods, systems and structures without departing from the scope thereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

I claim:

1. A low energy charged particle detector comprising:
a diode having:
a first layer with a first type of connectivity;
a top layer with a second type of connectivity physically coupled to the first layer with a junction therebetween, the top layer composed of a two-dimensional material providing a naturally electrically passivated exposed outer surface opposite the junction; and
a control circuit coupled to the diode.

2. The low energy charged particle detector of claim 1, wherein the two dimensional bonding structure of the two dimensional material provides the outer surface free of recombination-causing dangling bonds.

3. The low energy charged particle detector of claim 1 wherein the control circuit further includes a biasing circuit.

4. The low energy charged particle detector of claim 3, wherein the top layer is biased relative to the first layer.

5. The low energy charged particle detector of claim 1, wherein the outer surface is a charged particle receiving surface.

6. The low energy charged particle detector of claim 1, further including a current detector circuit operable to detect current through the junction in response to a low energy particle striking the outer surface.

7. The low energy charged particle detector of claim 1, wherein the diode is an avalanche diode, Schottky diode, PIN diode or PN diode.

8. The low energy charged particle detector of claim 1, wherein the top layer is a two-dimensional chalcogen-based material.

9. The low energy charged particle detector of claim 1, wherein the first and top layers each comprise multiple layers.

10. The low energy charged particle detector of claim 1, further including a charged particle transparent protective layer disposed upon the outer surface.

11. A low energy charged particle detector comprising:
a cathodoconductive device having;
an electrically insulating substrate;
a top layer disposed upon the substrate, the top layer composed of a two-dimensional material providing a naturally electrically passivated exposed outer surface free from dangling bonds, the top layer having a first end, and opposite thereto, a second end;
at least one first electrode disposed proximate to the first end of, and in electrical contact with, the top layer;
at least one second electrode disposed proximate to the second end of, and in electrical contact with, the top layer;
a control circuit coupled to the first and second electrodes.

12. The low energy charged particle detector of claim 11, wherein the control circuit further includes a voltage source providing a bias voltage across the first and second electrodes.

13. The low energy charged particle detector of claim 11, wherein the outer surface is a charged particle receiving surface.

14. The low energy charged particle detector of claim 11, further including a current detector circuit operable to detect current between the first and second electrodes in response to a low energy particle striking the outer surface.

15. The low energy charged particle detector of claim 11, wherein the top layer is a two-dimensional chalcogen-based material.

16. The low energy charged particle detector of claim 11, wherein the top layer is comprising multiple layers.

17. The low energy charged particle detector of claim 11, further including a charged particle transparent protective layer disposed upon the outer surface.

18. A low energy charged particle detector comprising:
a cathodotransistor device having:
a first layer;
a top layer composed of a two-dimensional material providing a naturally electrically passivated exposed outer surface free from dangling bonds;
an intermediate layer disposed between the first layer and the top layer;
at least one junction between the first layer and the top layer, defined by the intermediate layer;
a first voltage potential coupled to the top layer; and
a second voltage potential, unequal to the first voltage potential coupled to the first layer.

19. The low energy charged particle detector of claim 18, wherein the second voltage potential is ground.

20. The low energy charged particle detector of claim 18, wherein the first voltage potential negatively biases the top layer.

21. The low energy charged particle detector of claim 18, wherein the junction provides a conduction barrier under no incidence of charged particles upon the outer surface, the conduction barrier being diminished under an incidence of charged particles upon the outer surface.

22. The low energy charged particle detector of claim 18, wherein the outer surface is a charged particle receiving surface.

23. The low energy charged particle detector of claim 18, wherein the top layer is a two-dimensional chalcogen-based material.

24. The low energy charged particle detector of claim 18, further including a current detector circuit operable to detect current through the cathodotransistor device in response to a low energy particle striking the outer surface.

25. The low energy charged particle detector of claim 18, further including a charged particle transparent protective layer disposed upon the outer surface.

* * * * *

UNITED STATES PATENT AND TRADEMARK OFFICE
CERTIFICATE OF CORRECTION

PATENT NO. : 7,148,485 B2  Page 1 of 1
APPLICATION NO. : 10/857215
DATED : December 12, 2006
INVENTOR(S) : Gary A. Gibson It is certified that error appears in the above-identified patent and that said Letters Patent is hereby corrected as shown below:

On the Title page, in field (56), under "U.S. Patent Documents", in column 2, line 8, delete "2004/0085802" and insert -- 2004/0086802 --, therefor.

In column 11, line 5, in Claim 3, after "claim 1" insert -- , --.

In column 12, line 9, in Claim 16, delete "comprising" and insert -- comprised of --, therefor.

Signed and Sealed this

Seventh Day of July, 2009

JOHN DOLL
*Acting Director of the United States Patent and Trademark Office*